United States Patent [19]

Shuey et al.

[11] 3,781,572

[45] Dec. 25, 1973

[54] AC POWER CONTROL APPARATUS WITH DEMAND RESPONSIVE DRIVER CIRCUIT

[75] Inventors: Kenneth C. Shuey, Wapakoneta; Donal E. Baker, Lima, both of Ohio

[73] Assignee: Westinghouse Electric Corporation, Pittsburgh, Pa.

[22] Filed: Jan. 27, 1972

[21] Appl. No.: 221,276

[52] U.S. Cl. ........... 307/252 T, 307/252 N, 321/13, 321/38, 321/40

[51] Int. Cl. ............................................ H03k 17/72

[58] Field of Search .................... 307/252 N, 252 T; 321/13, 38, 40

[56] References Cited

UNITED STATES PATENTS 3,462,619 8/1969 Grees et al. .................... 307/252 Q 3,654,541 4/1972 Kelley, Jr. et al. .................... 321/13

3,681,676 8/1972 Bourbeau .......................... 321/13 X

*Primary Examiner*—John Zazworsky

*Attorney*—A. T. Stratton et al.

[57] ABSTRACT

AC power control apparatus with reduced power dissipation is provided wherein a three terminal semiconductor switch, such as a thyristor, has a demand responsive gate driver circuit that includes means to sense the voltage across the main terminals of the switch and a means responsive thereto to form a conduction path to the gate terminal only during periods when the main terminal voltage reaches a threshold value.

3 Claims, 7 Drawing Figures

AC POWER CONTROL APPARATUS WITH DEMAND RESPONSIVE DRIVER CIRCUIT

BACKGROUND OF THE INVENTION

1. Field of the Invention

This invention relates to electronic apparatus and particularly to improved driver circuit means for semiconductor switch devices.

2. Prior Art

Inherent limitations in mechanical and electromechanical switches and relays have resulted in a requirement for completely static or solid state relays. Known advantages including fast and controllable turn on and turn off times, insusceptibility to mechanical vibrations and shock, long life, and stable performance over large ambient temperature variations result from the use of static switches.

A popular form of static switch, particularly for AC power control, comprises a pair of thyristors connected in inverse parallel fashion. Devices such as thyristors require repeated application of driver signals to maintain conduction because of inherent turn off when an alternating waveform in the load circuit passes through zero. Thus these devices require a driver circuit for the gate terminal of each of the devices.

There are several known techniques for supplying gate drive current to thyristors as are discussed in copending application Ser. No. 168,906 filed Aug. 4, 1971 by K. C. Shvey and assigned to the present assignee, which should be referred to for further background.

In many power control applications an important consideration is the power loss in the switch devices. In this respect static switches do not inherently compare favorably with mechanical devices. The power loss in a static switch such as a thyristor is made up of essentially two components, the power loss due to the "contact" voltage drop across the static switch element and the power loss due to the driver circuit which is necessary to place the static switch in a conduction state.

By way of further background, FIGS. 1, 2 and 3 are referred to. FIG. 1 is a general circuit schematic of a pair of thyristors SCR1 and SCR2 connected in an inverse parallel configuration for controlling power supplied by an AC supply to a load. Each of the devices SCR1 and SCR2 have a pair of main terminals connected in the load circuit and a third or gate terminal to which a driver circuit is connected for each device.

FIG. 2 shows a set of waveforms for the case in which the driver circuits are of the pulse drive type. Waveform A shows an alternating voltage V1 from the AC supply. Waveforms B and C illustrate the pulses supplied by each of the driver circuits in the form of gate currents $I_{G1}$ and $I_{G2}$ to the respective switch elements. It can be seen this technique is characterized by applying a pulse of gate current to each thyristor at the start of each half cycle of conduction. Waveform D shows the voltage drop across either one of the switch elements for full load conditions. Waveform E shows the load current $I_L$ for full load conditions.

While satisfactory for full load conditions, the pulse drive technique relies upon the load current exceeding the thyristor holding current to sustain conduction through the remaining portion of the half cycle after the gate pulse is applied. The short duty cycle of the drive circuit is effective to minimize power losses. However, the result is a static switch that may not remain in conduction for certain load conditions. For leading or lagging power factor loads, unless the pulse is shifted with the current which is not a convenient procedure, the thyristors will not conduct for a full half cycle resulting in large contact voltage drop. Also, for light load conditions, it is possible that the load current will be less than the holding current of the thyristors. As a result the switch would not remain in conduction beyond the duration of the drive pulse and again will give high contact voltage drop and poor switch operation. The circumstances resulting under light load conditions are illustrated in waveforms F and G of FIG. 2 showing that where load current is less than the holding current there will be conduction only during the pulse periods and the voltage drop will otherwise be high.

To avoid the problems associated with the pulse drive technique, the continuous drive technique has been used previously. The waveforms of FIG. 3 illustrate the situation for continuous drive. Waveform A again represents a voltage waveform VI from the AC supply. Waveforms B and C represent the gate currents to each of the devices that are applied continuously with constant magnitude. D shows the voltage drop for full load and E shows the load current $I_L$ for load. F and G, respectively, show the load current and switch voltage drop for light load conditions. A comparison of waveforms F and G of FIG. 2 with the corresponding waveforms of FIG. 3 shows the improvement over the pulse drive technique. With continuous drive, minimum voltage drop is provided under conditions of light loading, and also under leading or lagging power factor conditions.

The improvement of the continuous drive technique over the pulse drive technique is obtained at the expense of supplying gate current even when it may not be needed, that is when the lead current exceeds the holding current. The result is a very inefficient drive circuit. To minimize this disadvantage it is necessary to select the thyristors for minimum gate drive current. Another approach that provides improvement is that disclosed in copending application Ser. No. 168,906, above-referred to, that permits the gate drive current to reduce itself when the thyristors are heated to an extent that lessens their requirements for gate drive current. It remains desirable to further improve the efficiency of gate drive circuits in AC power control apparatus and it was in furtherance of this purpose that the present invention cam about.

SUMMARY OF THE INVENTION

AC power control apparatus with reduced power dissipation is provided wherein a three-terminal semiconductor switch, such as a thyristor, has a demand responsive gate driver circuit that includes means to sense the voltage across the main terminals of the switch and a means responsive thereto to form a conduction path to the gate terminal only during periods when the main terminal voltage reaches a threshold value.

The sensing means and the means responsive thereto to form a conduction path may each comprise a semiconductor device such as a transistor which in the first means is connected in a manner across the main switch terminals so that it must become conductive due to a required magnitude of voltage occurring across the terminals before a base turn on signal is applied to the transistor in the second means turning it on and permitting gate current from the supply to be applied to the gate. When the voltage across the switch terminals drops as a result of turn on, the gate drive circuit will become nonconductive and no gate current will be supplied thereto, thus introducing no power losses as a result of the flow of such current.

A desirable form of the invention is that in which the gate drive current is developed from an AC to DC converter with the same alternating voltage source as for the load circuit.

THE DRAWING

DESCRIPTION OF THE PREFERRED EMBODIMENTS

Figure 1:
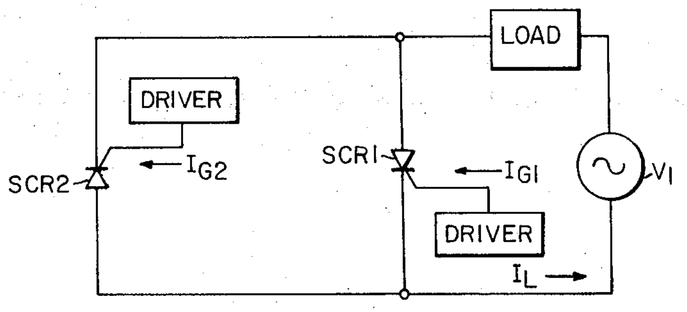
FIG. 1 PRIOR ART
FIG. 1 is a schematic circuit diagram illustrating a general type of circuit with which the present invention may be practiced.
Figure 2:
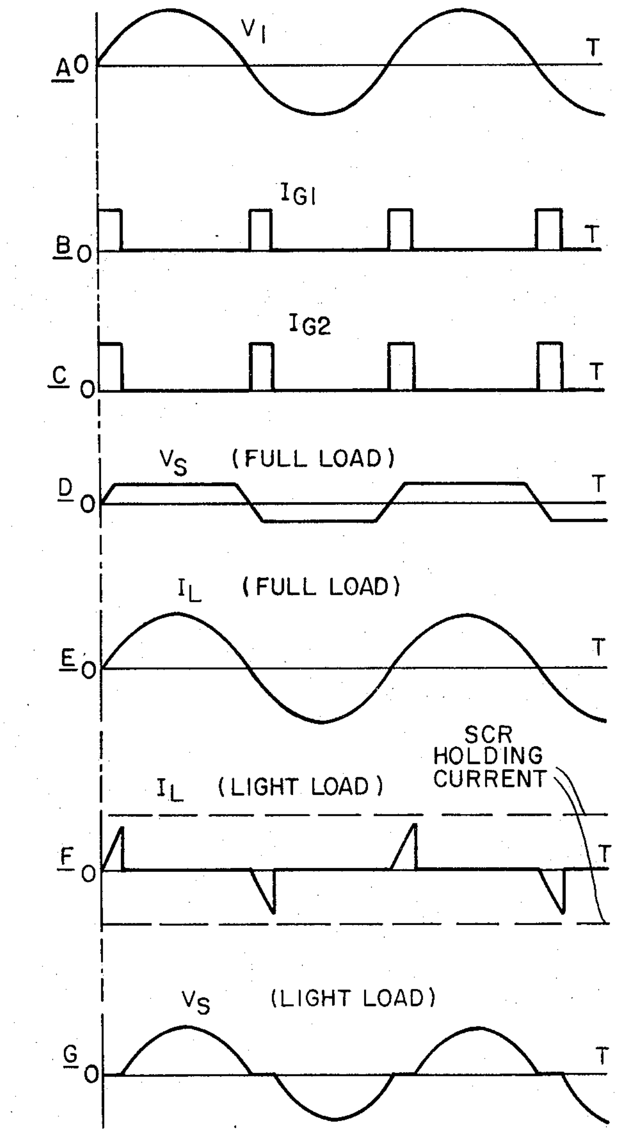
FIGS. 2 and 3 are sets of waveforms illustrating operation of driver circuits in accordance with the prior art, as has been discussed hereinbefore.
Figure 3:
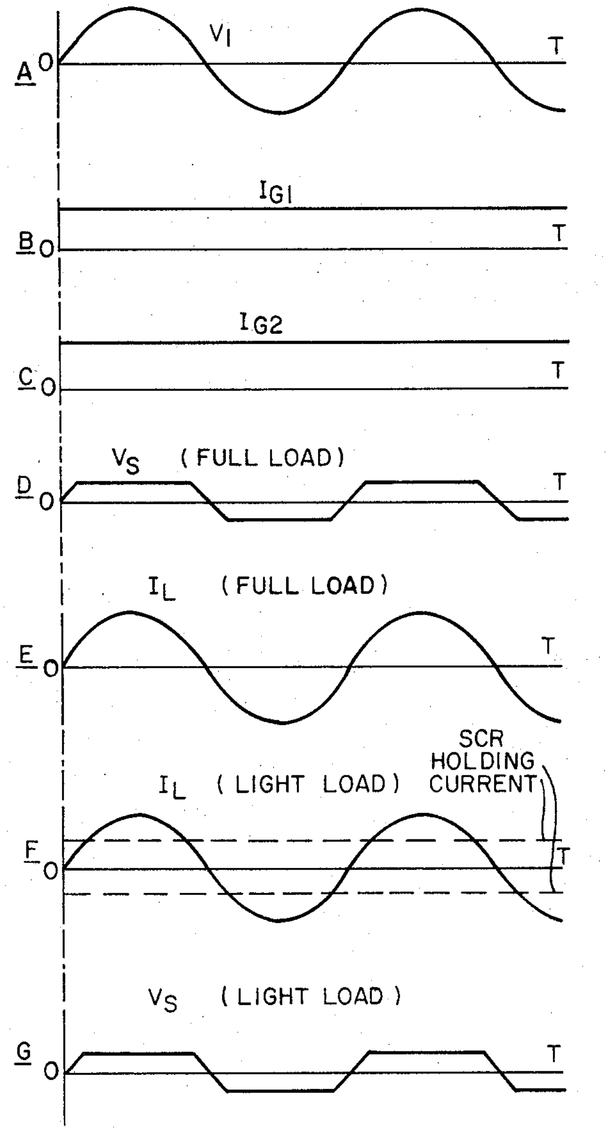
Figures 4, 5, 6, 7:
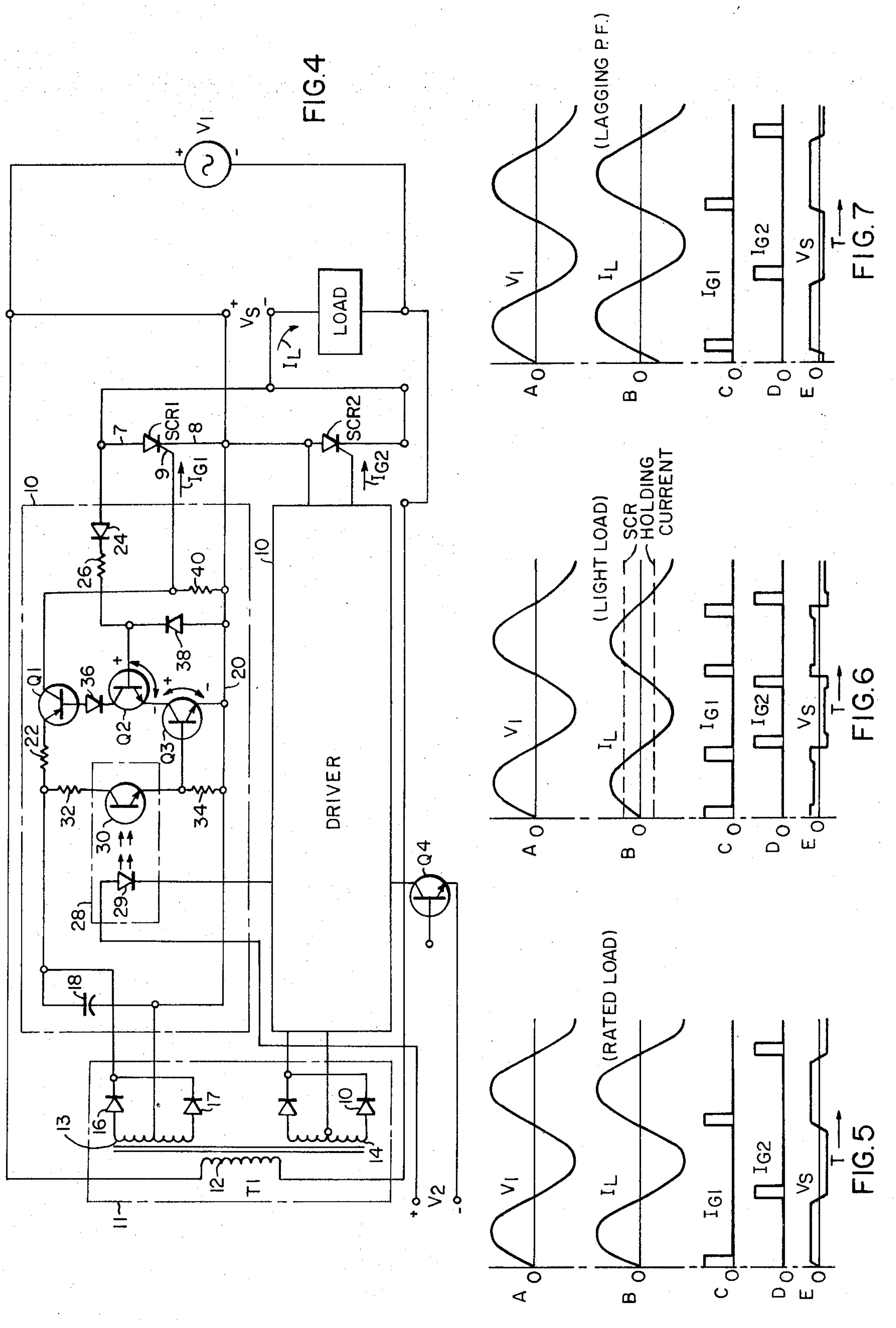
FIG. 4 is a schematic circuit diagram of an embodiment of the present invention.
FIGS. 5, 6 and 7 are sets of waveforms illustrating the operation of the driver circuit shown in FIG. 3.

Referring to FIG. 4, the elements of the circuit of FIG. 1 are shown including a demand responsive driver circuit 10 in accordance with the present invention. The two driver circuits 10 are preferably identical and therefore only one will be specifically referred to.

The gate drive current is preferably developed from the AC supply such as by use of a transformer T1 connected as an AC to DC converter 11 by means of which a single primary winding 12 is connected to the AC supply and isolated secondary windings 13 and 14 are respectively provided for each of the gate drive circuits. In accordance with known practice diodes 16 and 17 are respectively provided on each side of the secondary winding 13 and connected together to one side of a filter capacitor 18 the other side of which is connected to a center tap on the secondary winding 13. The center tap connection is connected with various other elements in a common circuit line 20 in the driver circuit which is also connected to the cathode of the thyristor SCR1. The other side of the filter capacitor 18 is connected, through a resistor 22, to a transistor Q1 (PNP in this example) whose emitter-collector path is between the DC supply 11 and the gate electrode 9 of SCR1. This path is controlled in accordance with this invention, as will subsequently be described in more detail, by a means for sensing the voltage across the main terminals 7 and 8 of SCR1. In this embodiment the means for sensing includes a circuit including a diode rectifier 24 having a finite threshold voltage $V_{24}$ to initiate conduction, a resistor 26, a transistor Q2 requiring a finite voltage drop $V_{BE2}$ between the base and emitter during conduction and a transistor Q3 requiring a finite voltage $V_{CE3}$ between the collector and emitter. Q2 and Q3 are both NPN transistors in this example. Exemplary polarities are indicated for a given half cycle.

Additional elements of the circuit shown are on-off control transistor Q4 (NPN) actuated by an external source for providing independent control. Q4 is coupled to the gate drive circuits by optically isolated element 28 including a light emitting diode 29 in series with the emitter-collector path of Q4 and an isolated phototransistor 30 connected across the driver circuit through resistors 32 and 34 on each side. Additionally are shown diode 36 connected between the base of transistor Q1 and the collector of transistor Q2 and diode 38, connected between the common line 20 and the base of transistor Q2. A resistor 40 is also provided between the gate electrode 9 and the common line 20.

The circuit of FIG. 4 may be modified by replacing the optical isolation unit 28, in each of the two driver circuits 10, with a single transformer connected with additional components in the known manner for a Royer oscillator. In such a configuration base current is applied to Q3 in the same manner as that performed by the optical isolator 28.

In operation when transistor Q4 is turned on by positive external control the light emitting diode 29 in the optical isolator 28 is forward biased. This provides a sufficient drive to produce radiation to saturate the phototransister 30. When the phototransistor 30 is on, base drive current is applied to saturate transistor Q3 through limiter resistor 32. Q2 can therefore become saturated but only if the voltage across SCR1 exceeds the junction voltage drops of the diode 24, the base-emitter voltage drop of transistor Q2 and the collector-emitter voltage drop of transistor Q3 ($V_{7\text{-}8} > V_{24} + V_{BE2} + V_{CE3}$). When this occurs base drive is provided for transistor Q2 which starts into conduction. This then starts Q1 into saturation. As Q1 turns on, gate drive current from the voltage supply is provided to SCR1 and the voltage across SCR1 drops to a saturated level. If the current to SCR1 is sufficient to sustain conduction, gate drive current will be removed until the next positive half cycle. However, if the load current level is below the holding current of SCR1, a level of gate drive will be provided to sustain conduction, even continuously if necessary. This level of gate drive is dependent on the characteristics of the thyristor, particularly the NPN section in considering the PNP-NPN analog of a thyristor, but will never exceed the holding current. In this manner the gate drive will be applied inversely with respect to load so that the drive dissipation is always within acceptable limits.

A circuit as shown in FIG. 4 was constructed and operated for a 115 volts AC, 400 Hz application with the following components which are presented merely by way of further example.

| | Identification |
|---|---|
| Transistor Q1 | 2N2904A |
| Transistors Q2 and Q4 | 2N2219A |
| Transistor Q3 | 2N3440 |
| SCR1 and SCR2 | Westinghouse Type 250 |
| Transformer T1 | 0.5 in I.D., 0.75 in. O.D., 0.125 in.thick Hypersil alloy |
| Diodes 16 and 17 | Westinghouse Type 388A |
| Capacitor 18 | 22 microf., 20 v., tantalum |
| Diodes 36 and 38 | 1N4005 |
| Optical Isolation Element 28 | MCT2 |
| Resistor 22 | 50 ohms, ½ W. |
| Resistor 26 | 390 ohms, ½ W. |
| Resistor 32 | 6000 ohms, ½ W. |
| Resistor 34 | 47000 ohms, ½ W. |
| Resistor 40 | 390 ohms, ½ W. |

FIGS. 5, 6, and 7 are sets of waveforms illustrating operation of the circuit in accordance with this invention under various load conditions. FIG. 5 is for the case in which the load current $I_L$ is at full rated load (waveform B). In this instance pulses are applied to each of the SCR gates only during an initial portion of the positively swinging half cycle (waveforms C and D). This feature itself reduces dissipation as compared with the formerly used pulse drive techniques which required pulses at the beginning of each half cycle.

FIG. 6 shows the case in which the load current, waveform B, is less than full rated load and may go less than the holding current of the thyristor. Here there will be gate drive pulses (waveforms C and D) during all portions of each half cycle that the load current is less than the holding current.

FIG. 7 illustrates conditions for a lagging power factor load current which also is a case in which brief pulses of gate current are provided during those occasions when the load current is unable to sustain conduction.

What is claimed is:

1. An AC switch comprising in combination: an alternating voltage source connected across a load and switch means to control the application of said alternating voltage to said load; said switch means comprising a three-terminal semiconductor device having a pair of terminals connected in a circuit path between said source and said load and a gate terminal connected to a demand responsive driver circuit, said demand responsive driver circuit including a first means connected across said first pair of terminals for sensing the voltage across said first pair of terminals, said first means comprising a first transistor maintained in an off condition except when the voltage across said first pair of terminals reaches a threshold value at which said transistor becomes conductive, said first means also including a second transistor that is responsive to an external condition to permit operation of said demand responsive driver circuit and a second means in series with said gate terminal and responsive to said first means for closing a conduction path to said gate terminal only during periods when said voltage across said first pair of terminals reaches said threshold value, said second means comprising a third transistor turned on when said first transistor of said first means becomes conductive.

2. The subject matter of claim 1 wherein: said device of said switch means is a first thyristor and said switch means further comprises a second thyristor connected in an inverse parallel configuration with said first thyristor; and an individual demand responsive driver circuit as defined is connected to said gate terminal of each of said thyristors.

3. The subject matter of claim 2 further comprising: an AC to DC converter has an isolated DC output connected to each of said demand responsive driver circuits.

* * * * *